(12) United States Patent  
Chong et al.

(10) Patent No.: US 7,307,319 B1
(45) Date of Patent: Dec. 11, 2007

(54) HIGH-VOLTAGE PROTECTION DEVICE AND PROCESS

(75) Inventors: Nui Chong, San Jose, CA (US); Farrokh Omid-Zohoor, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 371 days.

(21) Appl. No.: 10/837,086

(22) Filed: Apr. 30, 2004

(51) Int. Cl.
*H01L 23/62* (2006.01)
(52) U.S. Cl. .................................... 257/355; 257/366
(58) Field of Classification Search ......... 257/355–363
See application file for complete search history.

(56) References Cited

U.S. PATENT DOCUMENTS

| | | | |
|---|---|---|---|
| 5,270,565 A | 12/1993 | Lee et al. | |
| 5,276,346 A | 1/1994 | Iwai et al. | |
| 5,801,431 A | 9/1998 | Ranjan | |
| 5,959,332 A | 9/1999 | Ravanelli | |
| 6,015,993 A * | 1/2000 | Voldman et al. | 257/355 |
| 6,066,863 A | 5/2000 | Fujishima | |
| 6,081,002 A | 6/2000 | Amerasekera | |
| 6,232,163 B1 | 5/2001 | Voldman et al. | |
| 6,515,331 B1 | 2/2003 | Carneiro et al. | |
| 6,552,399 B2 | 4/2003 | Jun | |
| 6,717,219 B1 | 4/2004 | Vashchenko | |
| 6,720,622 B1 | 4/2004 | Yu | |
| 6,750,515 B2 | 6/2004 | Ker | |
| 6,765,771 B2 | 7/2004 | Ker | |
| 6,806,160 B2 | 10/2004 | Ker | |
| 2003/0067040 A1 | 4/2003 | Chen | |
| 2003/0173630 A1 | 9/2003 | Lin et al. | |
| 2003/0201498 A1 | 10/2003 | Hu et al. | |
| 2003/0213971 A1 | 11/2003 | Yu | |
| 2003/0222273 A1 | 12/2003 | Kunz et al. | |
| 2005/0035410 A1 | 2/2005 | Yeo | |

OTHER PUBLICATIONS

U.S. Appl. No. 10/699,321, filed Oct. 31, 2003, Logie.

\* cited by examiner

*Primary Examiner*—Cuong Nguyen

(57) ABSTRACT

A high-voltage circuit protection device includes a p-n junction in a semiconductor substrate that is spaced apart from a first electrode region by a diode region. A semiconductor layer overlies the diode region and is separated therefrom by a dielectric layer. A shallow-doped region resides in the diode region spaced apart from the p-n junction by a predetermined distance. The predetermined distance preferably ranges from about 0 to about 50% of the length of the diode region. A process for fabricating the high-voltage device includes forming the shallow-doped region using a threshold adjustment mask followed by formation of the first electrode region using the semiconductor layer in a self-aligned doping process. The shallow-doped region functions to reduce the clamping voltage of the device.

3 Claims, 4 Drawing Sheets

HIGH-VOLTAGE PROTECTION DEVICE AND PROCESS

RELATED APPLICATION

Similar subject matter is disclosed in co-pending, commonly-assigned patent application Ser. No. 10/699,321, filed Oct. 31, 2003.

TECHNICAL FIELD

The present invention relates, generally, to semiconductor devices and to processes for their fabrication and, more particularly, to semiconductor devices designed to handle high voltages in reference circuits, voltage clamps, and electrostatic discharge (ESD) protection circuits and to processes for their fabrication.

BACKGROUND

As integrated circuits increase in complexity and decrease in size, the circuits become more susceptible to damage from high voltage transients. Presently, circuits having metal-oxide-semiconductor (MOS) transistors with gate lengths on the order of 0.15 microns or less operate at voltage levels below about 3.0 volts. Circuits having such small feature sizes are vulnerable to dielectric breakdown during high voltage transients. Additionally, many circuits such as memory devices and the like include high speed input/output nodes that require individual high-voltage protection devices. Accordingly, many circuits require multiple high-voltage protection devices. To avoid interfering with circuit operation, it is important that the protection circuit not create high parasitic line capacitance.

Devices for protecting circuits against high-voltage transients such as ESD events include resistors, rectifiers, clamped MOS transistors acting as lateral bipolar devices, and serially or parallel connected diodes. In order to keep fabrication costs low and to maintain a compact circuit layout, high-voltage protection devices are typically fabricated with the same processing steps as those employed to fabricate the functional components of the protected circuit. In particular, various diode configurations have been developed for integration into standard circuit fabrication processes. Typically, diodes are formed by creating p+ and n+ regions in a semiconductor substrate. This particular diode structure is highly compatible with processes used to form complementary-MOS (CMOS) devices. The p-n junction can be created by special ion implantation processes devoted to the creation of the n+ and p+ regions in the substrate, or by taking advantage of the p-n junctions created in the substrate by the p+ and n+ well regions.

Further improvement in the high-voltage protection offered by diode protection circuits can be realized by creating diodes with polysilicon gate structures. The polysilicon gate diode, or poly-bounded diode, is effective in protecting circuits from high-voltage transients and can be fabricated to have low parasitic capacitance. In the poly-bounded diode, a silicon channel region beneath the polysilicon layer separates the n+ region and the p+ region in the substrate. The silicon channel region improves diode ESD performance by dissipating heat and reducing the current density through the diode. Additionally, the silicon channel region functions to lower the parasitic capacitance to levels below that obtainable in diodes lacking a silicon channel region.

While poly-bounded diodes offer an effective means for protecting MOS circuit against high-voltage transients, further improvements are needed to increase the diode performance as circuit dimensions are reduced.

SUMMARY

In accordance with an embodiment of the invention, there is provided a high-voltage circuit protection device that includes a semiconductor substrate and a p-n junction in the semiconductor substrate. The p-n junction is separated from a first electrode region by a diode region. A semiconductor layer overlies the diode region and is separated therefrom by a dielectric layer. A shallow-doped region resides in the diode region spaced apart from the p-n junction by a predetermined distance.

In another embodiment of the invention, a high-voltage protection device includes a substrate having a well region therein. First and second diode regions reside in the well region and are separated by a first doped region. A first semiconductor layer overlies the first diode region and is separated therefrom by a dielectric layer. A second semiconductor layer overlies the second diode region and is separated therefrom by a dielectric layer. A first shallow-doped region resides in the first diode region and is spaced apart from the first doped region by a first predetermined distance. A second shallow-doped region resides in the second diode region and is spaced apart from the first doped region by a second predetermined distance.

In yet another embodiment of the invention, an input protection circuit includes a voltage supply node and a ground node. An MOS circuit is coupled to the supply voltage node and to the ground node. A diode has a first junction region coupled to the voltage supply node, a second junction region coupled to the ground node, and a diode region between the first and second junction regions. An MOS gate electrode overlies the diode region and is separated therefrom by a gate oxide layer. A shallow-doped region resides in the diode region adjacent to the first junction region and is spaced apart from the second junction region by a predetermined distance.

In a further embodiment of the invention, a process for fabricating a high-voltage protection device includes providing a substrate having a well region therein. A diode region is formed in the well region, where the diode region is bounded by a p-n junction and by an electrode region. A threshold adjustment mask is formed on the substrate that exposes a portion of the diode region. Dopants are introduced into the diode region to form a shallow-doped region in the diode region. The shallow-doped region resides adjacent to the electrode region and is spaced apart from the p-n junction by a predetermined distance.

In a still further embodiment of the invention, a method for reducing the clamping voltage in a voltage protection diode includes forming a diode region in a substrate between a p-n junction and an electrode region. A shallow dope region is formed in the diode region adjacent to the electrode region and spaced apart from the p-n junction by a predetermined distance.

Figure 1:
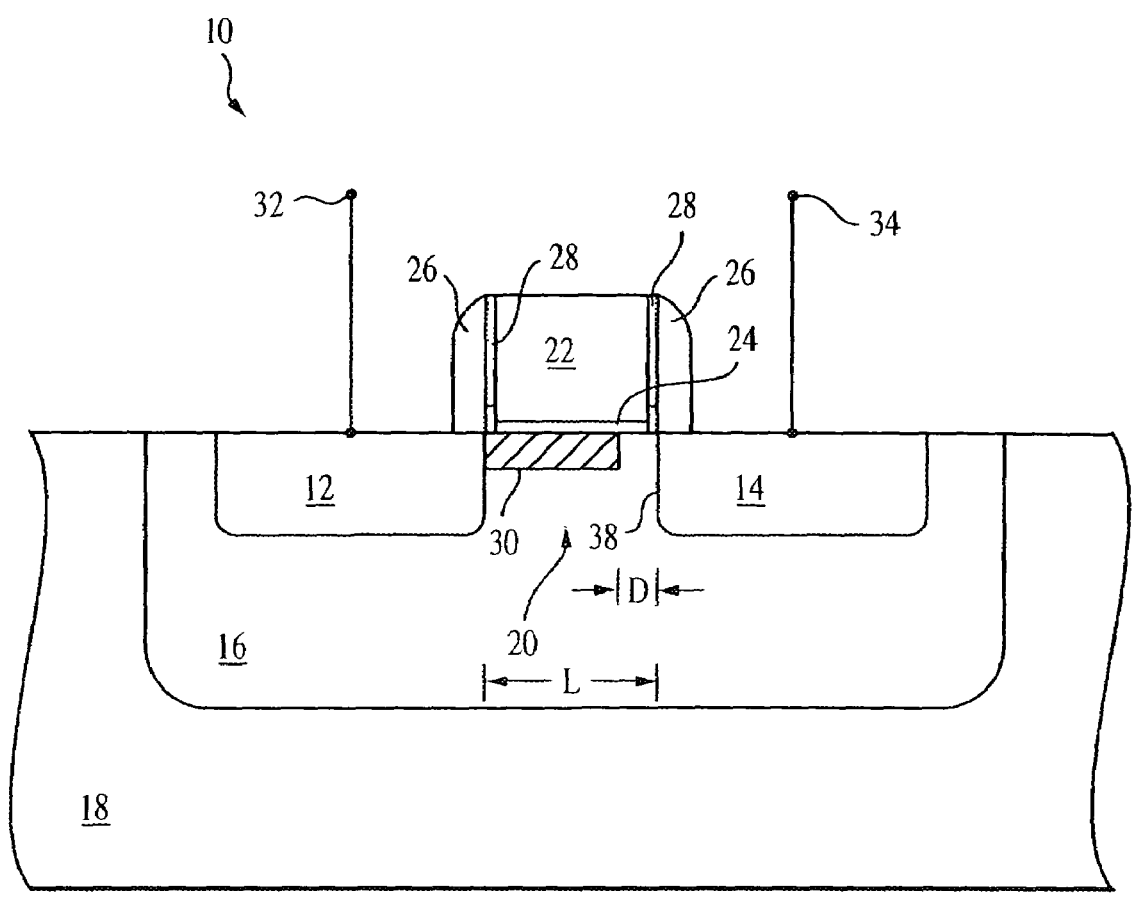
FIG. 1 illustrates, in cross-section, a high-voltage circuit protection device arranged in accordance with one embodiment of the invention.

It will be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION

Shown in FIG. 1 in cross-section, is a circuit protection device 10 arranged in accordance with one embodiment of the invention. Circuit protection device 10 includes a first doped region 12 and a second doped region 14 formed within a well region 16 of a semiconductor substrate 18. First doped region 12 is spaced apart from second doped region 14 by a diode region 20. A semiconductor layer 22 overlies diode region 20 and is separated therefrom by a dielectric layer 24. Semiconductor layer 22 has sidewall spacers 26 adjacent to the vertical edges of semiconductor layer 22 and spaced therefrom by dielectric sidewall layer 28. A shallow-doped region 30 resides in diode region 20 adjacent to first doped region 12 and is spaced apart from second doped region 14 by a predetermined distance D. First and second doped regions 12 and 14 serve as electrode regions that are coupled to a circuit to be protected by circuit connections 32 and 34, respectively.

In accordance with the invention, the components of circuit protection device 10 are readily fabricated by known fabrication processes used to form the various device components of an MOS circuit. Accordingly, well region 16 is formed by a doping and diffusion process carried out to form many such well regions in semiconductor substrate 18. Further, semiconductor layer 22 and first and second doped regions 12 and 14 are formed by the same process used to fabricate gate electrodes and self-align source and drain regions for MOS transistors (not shown). Additionally, in one preferred embodiment of the invention the substrate doping process used to adjust the threshold voltages of the MOS transistors is used to form shallow-doped region 30.

In one particular method for fabricating circuit protection device 10, a sacrificial oxide layer (not shown) is formed on a principle surface 36 of semiconductor substrate 18. In accordance with known processing methods, a lithographic mask (not shown) is formed on the sacrificial oxide layer. The lithographic mask exposes regions of substrate 18 that are to receive a threshold adjust ion implant. In the instance of fabricating N-channel MOS transistors, a p-typed dopant, such as boron, is implanted into semiconductor substrate 18 in regions where MOS transistor channels are to be formed. In accordance with one embodiment of the invention, shallow-doped region 30 is formed simultaneously with the formation of p-type threshold-adjust regions in semiconductor substrate 18. In accordance with the instant embodiment, well region 16 is also a p-type semiconductor region.

Once shallow-doped region 30 is formed, dielectric layer 24 is preferably formed by the thermal oxidation of principle surface 36 to form a silicon oxide dielectric layer. In accordance with known methods, polysilicon gate electrodes are formed for MOS transistors and, in accordance with the instant embodiment, also form semiconductor layer 22 as an MOS gate electrode. Those skilled in the art will appreciate that various types of semiconductor material in addition to polycrystalline silicon can be used to fabricate semiconductor layer 22. For example, the semiconductor materials can include amorphous silicon and refractory metal silicides, and the like After forming semiconductor layer 22, a self-aligned ion implantation process is carried out to form source and drain regions for the MOS transistors (not shown) and to form first and second doped regions 12 and 14 in semiconductor substrate 18. In accordance with the instance embodiment, the fabrication of first and second doped regions 12 and 14 differs from conventional self-aligned ion implantation in that regions 12 and 14 have opposite conductivity type. In particular, circuit protection device 10 includes a p-n junction 38 formed by the interface of second doped region 14 and well region 16. Accordingly, second doped region 14 is formed by ion implantation of an n-type dopant, such as phosphorous, and the like. Correspondingly, first doped region 12 is p-type region formed by the ion implantation of a p-type dopant, such as boron. Although first and second doped regions 12 and 14 are self-aligned to the edges of semiconductor layer 22, the implantation processes used to form first and second doped regions 12 and 14 include an intervening masking process to alternately protect portions of the substrate from receiving an undesired implant. After forming first and second doped regions 12 and 14, a conventional sidewall spacer forming process is carried out to create sidewall spacers 26 on semiconductor layer 22.

By a mask registration process, semiconductor layer 22 is formed so as to space a metallurgical p-n junction 38 at a predetermined distance D from shallow-doped region 30. Further, the self-align implant process results in diode region 20 having a characteristic length L. In accordance with one preferred embodiment of the invention, the predetermined distance D preferably ranges from about 0 to about 50% of diode length L, although a distance outside that range is possible. For Example, the distance D can range up to about 100% of diode length L. The particular value of distance D depends upon numerous factors, including the doping concentration of first and second doped regions 12 and 14 and shallow-doped region 30, the voltage levels over which the MOS circuit operates, and the like. The formation of shallow-doped region 30 improves the performance of circuit protection device 10 by increasing the electrical conduction characteristics of diode region 20. Increased conductivity in diode region 20 permits the device to divert discharge current more effectively than in similar devices lacking a doped region, such as shallow-doped region 30.

Those skilled in the art will appreciate that devices, such as circuit protection device 10, divert voltage transients by discharging current in forward bias mode once the voltage potential rises above the turn-on voltage. The voltage building up in the protected circuit that is coupled to circuit protection device 10 through circuit connections 32 and 34 will then be clamped because a conductive path is formed. Accordingly, the clamping voltage is an important parameter in accessing the performance of a circuit protection device and, in particular, the clamping voltage should be as low as possible. Additionally, the device should conduct a sufficient amount of current when an abrupt rise in leakage current occurs during a high voltage transient.

The failure current is the current handled by the protection device when an abrupt rise in leakage current is detected.

The failure current should be as high as possible. In accordance with the invention, the formation of shallow-doped region 30 reduces the clamping voltage and increases the failure current while avoiding an increase in diode capacitance. Those skilled in the art will appreciate that increasing the diode length L enhances the failure current but also increases the clamping voltage as a result of increased channel resistance. By introducing doped region 30 in diode region 20, the beneficial effects of the increased failure current can be realized while reducing the clamping voltage of the protection device.

In accordance with the invention, the distance D is adjusted to provide optimum channel conductance in diode region 20. Accordingly, the value of predetermined distance D can vary depending upon the particular performance characteristics desired and the particular geometric characteristics and doping levels of circuit protection device 10. Accordingly, predetermined distance D can have a minimum value equivalent to minimum design rules for mask registration and preferably is a non-zero value. Although a non-zero value of predetermined distance D is preferred, a circuit protection device fabricated in accordance with the invention will also exhibit enhanced voltage protection properties when the predetermined distance D is equal to zero.

In one preferred embodiment of the invention, the shallow-doped region is formed by ion implantation of boron at about 35 KeV in a dose of about 4.45 E12 ions per square centimeter. Those skilled in the art will appreciate that circuit protection device 10 can be fabricated to have regions of opposite conductivity type to that described above. In particular, the conductivity type of well region 16, first and second doped regions 12 and 14, and shallow-doped region 30 can be reversed. When circuit protection device 10 is fabricated to have regions of opposite conductivity to the type described above, shallow-doped region 30 is preferably formed by the ion implantation of arsenic at about 150 KeV at a dose of about 2.1 E12 ions per square centimeter.

Figure 2:
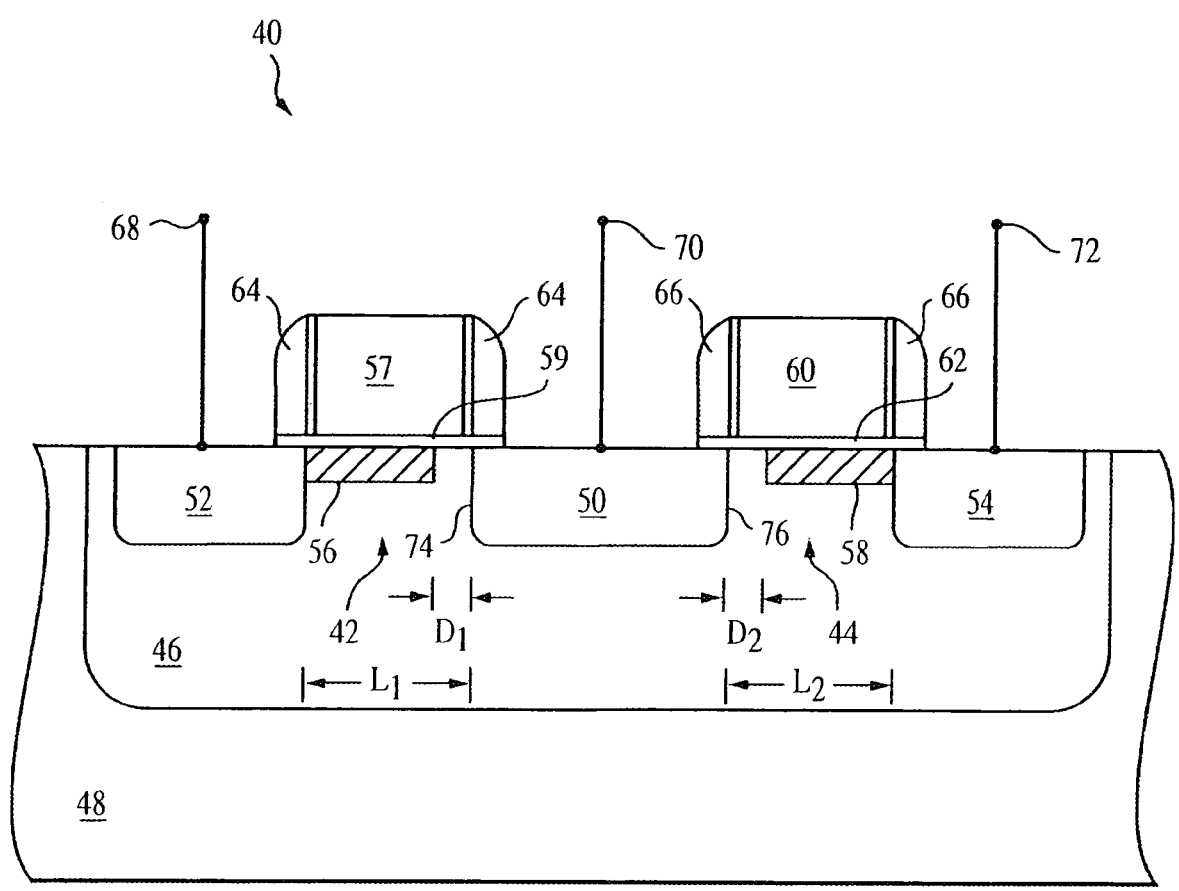
FIG. 2 illustrates, in cross-section, a high-voltage circuit protection device arranged in accordance with another embodiment of the invention.

A circuit protection device 40 arranged in accordance with another embodiment of the invention is illustrated in FIG. 2. Circuit protection device 40 includes a first diode region 42 and a second diode region 44 within a well region 46. Well region 46, in turn, resides within a semiconductor substrate 48. A first doped region 50 resides in well region 46 and separates first diode region 42 from second diode region 44. Circuit protection device 40 also includes a second doped region 52 and a third doped region 54. As evident from FIG. 2, doped regions 50, 52, and 54 serve as electrode regions for device 40. A first shallow-doped region 56 resides in first diode region 42 and a second shallow-doped region 58 resides in second diode region 44. Further, a first semiconductor layer 57 overlies first diode region 42 and is separated therefrom by a dielectric layer 59. Similarly, a second semiconductor layer 60 overlies second diode region 44 and is separated therefrom by a dielectric layer 62. Sidewall spacers 64 reside adjacent to vertical edges of first semiconductor layer 57 and sidewall spacers 66 reside adjacent to the vertical edges of second semiconductor layer 60. Circuit protection device 40 is coupled to a circuit to be protected by circuit connections 68, 70, and 72.

In accordance with the illustrated embodiment, first and second shallow-doped regions 56 and 58 are separated from first doped region 50 by a predetermined distance D. In particular, first shallow-doped region 56 is separated from first doped region 50 by a distance $D_1$. Correspondingly, second shallow-doped region 58 is separated from first doped region 50 by a distance $D_2$.

Circuit protection device 40 is fabricated to create a first p-n junction 74 in first diode region 42 and a second p-n junction 76 in second diode region 44. In accordance with the instant embodiment, first and second shallow-doped regions 56 and 58 are of the same conductivity type as well region 46. Further, where circuit protection device 40 is an n-type device, first doped region 50 is an n-type region, while second and third doped region 52 and 54 are p-type regions. Correspondingly, first and second shallow-doped regions 56 and 58 and well region 46 are p-type regions. Circuit protection device 40 can be fabricated using processing steps similar to those described above for the fabrication of circuit protection device 10.

In accordance with the instant embodiment, the values of predetermined distances $D_1$ and $D_2$ preferably vary from about zero to about 50% of the length of first and second diode regions 42 and 44, respectively. Further, depending upon the desired conductance characteristics, predetermined distances $D_1$ and $D_2$ can be of equal values, or alternatively, can have different values. In a preferred embodiment, predetermined distances $D_1$ and $D_2$ have non-zero values that approach the resolution limit of the lithographic mask used to form first and second shallow-doped regions 56 and 58, respectively.

Figure 3:
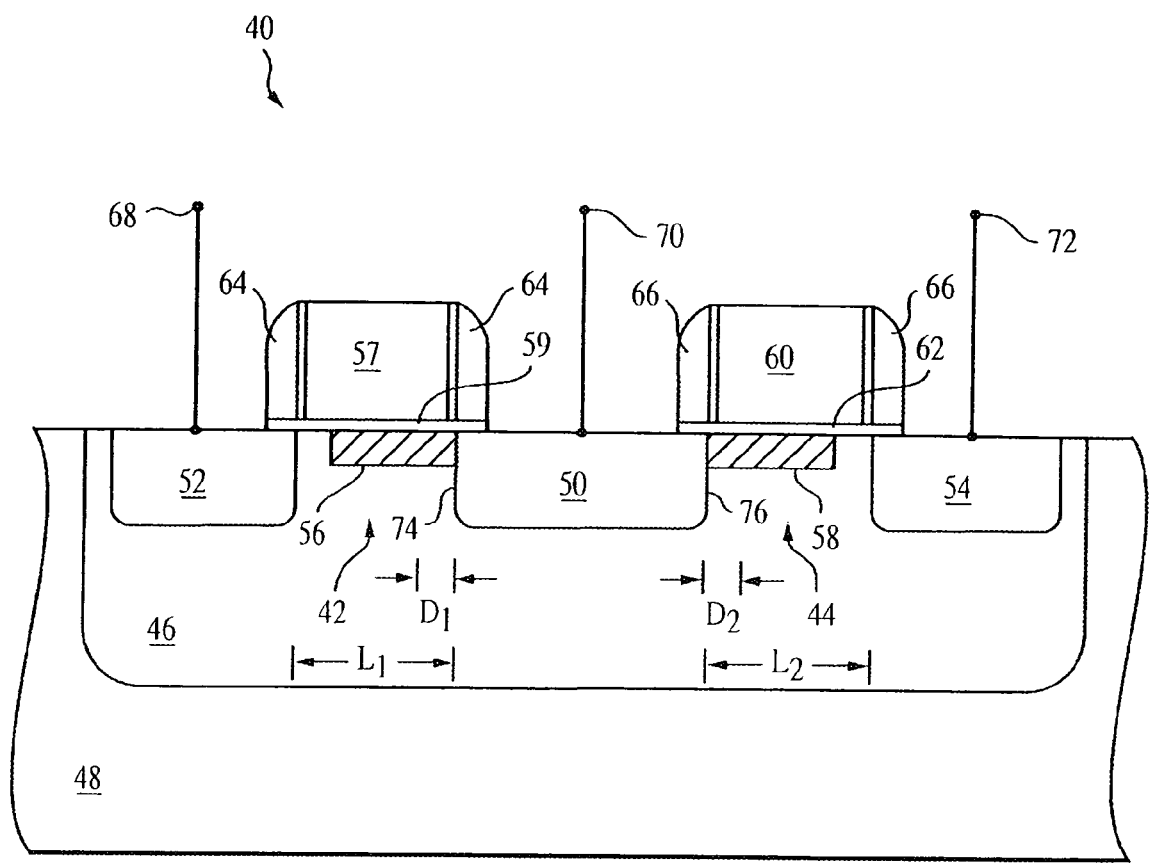
FIG. 3 illustrates, in cross-section, a high-voltage circuit protection device arranged in accordance with yet another embodiment of the invention.

In accordance with yet another embodiment of the invention circuit protection device 40 is arranged such that shallow doped layers 56 and 58 reside adjacent to first doped region 50 ($D_1$ and $D_2$ are each zero). As illustrated in FIG. 3, shallow doped region 56 resides adjacent to first p-n junction 74 and extends into first diode region 42 toward second doped region 52. Correspondingly, shallow doped region 58 resides adjacent to second p-n junction 76 and extends into second diode region 44 toward third doped region 54. The shallow doped regions 56, 58 thus can be adjacent to or spaced a non-zero distance from doped regions 52, 54, depending on the desired performance of device 40. The same is true for regions 30 and 12 of device 10 in FIG. 1.

The features illustrated in FIG. 3 are substantially similar to those described above with respect to the embodiment illustrated in FIG. 2. In accordance with the invention, improved diode performance is obtained from a circuit protection device fabricated in accordance with the embodiments illustrated in FIGS. 2 and 3.

Experiments carried out on test devices having circuit protection devices similar to circuit protection device 10 show improvement over corresponding protection devices lacking a shallow-doped region. Table I shows failure current values and clamping voltages for diodes fabricated with and without a shallow-doped region within the diode region.

TABLE 1

Clamp Voltage And Failure Current

| Structure | Diode Structure | VT Implant | Poly Length (um) | D (um) | V-Clamp @ 1.33 A (V) | Failure Current (A) |
|---|---|---|---|---|---|---|
| 1 | P +/nwell | No | 0.32 | — | 2.7 | 6.8 |
|   | N +/psub  | No | 0.32 | — | 2.5 | 6.8 |
| 2 | P +/nwell | Yes | 0.32 | 0.16 | 1.7 | 7.3 |
|   | N +/psub  | Yes | 0.32 | 0.16 | 1.4 | 8.0 |
| 3 | P +/nwell | Yes | 0.32 | 0.08 | 1.3 | 8.0 |
|   | N +/psub  | Yes | 0.32 | 0.08 | 1.2 | 9.1 |

In Table I, structure 1 was fabricated to have the structural features illustrated in FIGS. 2 and 3, but without a shallow doped region in the diode region. Structures 2 and 3 were fabricated to have the features illustrated in FIG. 3. As indicated in Table I, the predetermined distance D varied by about 0.08 microns between structures 2 and 3.

A comparison of the values illustrated in Table I indicates a pronounced improvement in clamping voltage and failure current as a result of the formation of a shallow-doped region.

Figure 4:
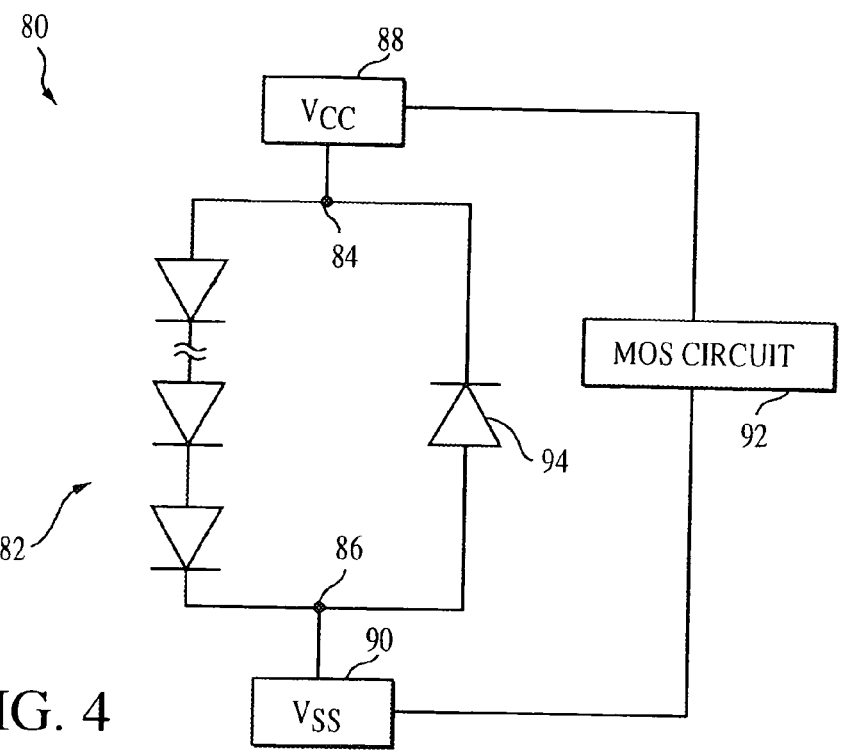
FIG. 4 is a schematic diagram of a high-voltage protection circuit arranged in accordance with an embodiment of the invention.

Those skilled in the art will appreciate that the high-voltage circuit protection devices illustrated in FIGS. 1-3 can be arranged in a variety of configurations to provide over voltage protection to MOS circuits. Illustrated in FIG. 4 is one embodiment of an input protection circuit 80 that includes a plurality of forward biased diodes 82. The diodes are connected in series between a voltage supply node 84 and a ground node 86. Nodes 84 and 86 are coupled to voltage supplies 88 and 90, respectively. An MOS circuit 92 is also coupled to voltage supplies 88 and 90.

In operation, input protection circuit 80 functions to shunt voltage transients occurring at node 84 away from MOS circuit 92. Forward bias diodes 82 divert discharge currents once the potential at node 84 rises above their turn-on voltage. The voltage building up at node 84 is clamped because of the conductive path formed by protection circuit 80. An opposite biased diode 94 serves as a voltage clamp during a negative discharge at node 84 with respect to node 86. In accordance with the illustrated embodiment, any number of forward bias diodes can be connected in series between nodes 84 and 86. The diodes are connected, such that a first junction region of the first diode is coupled to voltage supply 88, and the second junction region of the $N^{th}$ diode is coupled to ground supply 90.

Figure 5:
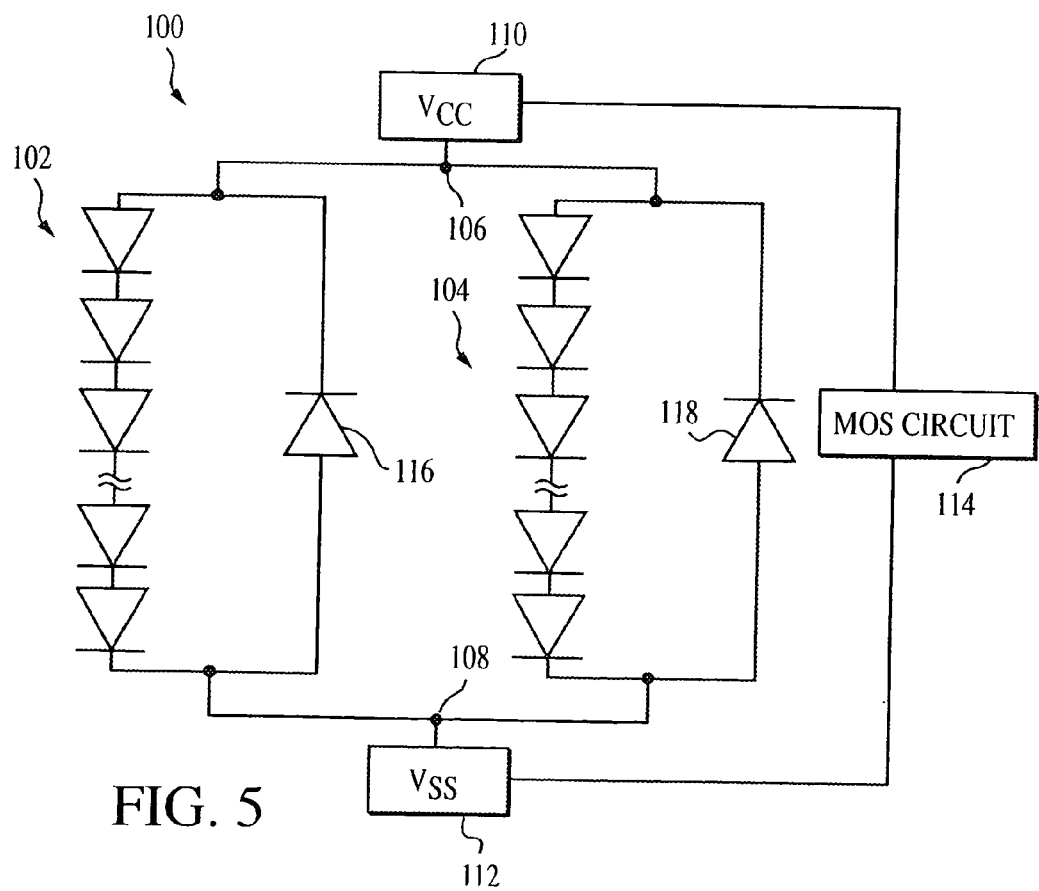
FIG. 5 is a schematic diagram of a high-voltage protection circuit arranged in accordance with another embodiment of the invention.

A schematic diagram of an input protection circuit 100 arranged in accordance with another embodiment of the invention is illustrated in FIG. 5. Protection circuit 100 includes two forward-biased diode stacks 102 and 104 connected in parallel between a voltage supply node 106 and a ground node 108. Voltage supply node 106 is coupled to a voltage supply 110 and ground node 108 is coupled to a voltage supply 112. An MOS circuit 114 is coupled between voltage supplies 110 and 112. A voltage clamp diode 116 is connected in parallel with diode stack 102 and voltage clamping diode 118 is connected in parallel with diode stack 104.

In accordance with the illustrated embodiment, diode stacks 102 and 104 can include any of a number of forward biased diodes connected in series. The number of diodes in first and second diode stacks 102 and 104 can be varied depending upon the desired turn-on voltage and clamping voltage of protection circuit 100. A fall off in the failure current values can be affected by increasing the number of parallel connected diode stacks. Accordingly, the instant invention contemplates the use of any number of parallel-connected diode stacks, such as diode stacks 102 and 104.

Thus, it is apparent that there has been described in accordance with the invention, a high-voltage circuit protection device and method for fabricating the device that fully provides the advantages set forth above. Those skilled in the art will recognize that numerous modifications and variations without departing from the spirit and scope of the invention. For example, the high-voltage protection device can include a plurality of diode regions separated by doped regions of alternating conductivity type. Further, various fabrication methods, such as electron-cyclotron-resonance (ECR) etching and X-ray lithography, deep-UV lithography, and the like, can be used to fabricate the high-voltage protection devices of the invention. Further, the devices disclosed herein can function similarly to lateral bipolar transistors. Accordingly, all such variations and modifications are intended to be included within the scope of the appended claims and equivalents thereof.

The invention claimed is:

1. A high-voltage protection device comprising:
    a substrate having a well region therein;
    first and second electrode regions in the well region and separated by the length of a diode region, the electrode regions being of opposite conductivity type;
    a shallow-doped region in the diode region adjacent to the first electrode region and spaced apart from the second electrode region by a predetermined distance no more than about 50% of the diode region length, the shallow-doped region being of a same conductivity type as the first electrode region and shallower in depth than the electrode regions, wherein the shallow-doped region has a doping concentration lower than the doping concentration of the electrode regions; and;
    a gate electrode overlying the diode region and shallow-doped region and separated therefrom by a dielectric layer.

2. The protection device of claim 1 including:
    a third electrode region in the well region separated from the first electrode region by the length of a second diode region, the first and third electrode regions being of opposite conductivity type;
    a second gate electrode overlying the second diode region and separated therefrom by a second dielectric layer; and
    a second shallow-doped region in the second diode region adjacent to the first electrode region and spaced apart from the third electrode region by a predetermined distance, the shallow-doped region being of a same conductivity type as the third electrode region and shallower in depth than the first and third electrode regions.

3. The protection device of claim 1 including:
    a third electrode region in the well region separated from the second electrode region by the length of a second diode region, the second and third electrode regions being of opposite conductivity type;
    a second gate electrode overlying the second diode region and separated therefrom by a second dielectric layer; and
    a second shallow-doped region in the second diode region adjacent to the third electrode region and spaced apart from the second electrode region by a predetermined distance, the shallow-doped region being of a same conductivity type as the third electrode region and shallower in depth than the second and third electrode regions.

* * * * *